(12) United States Patent
Radosavljevic et al.

(10) Patent No.: US 8,869,003 B2
(45) Date of Patent: *Oct. 21, 2014

(54) METHOD, APPARATUS, COMPUTER PROGRAM PRODUCT AND DEVICE PROVIDING SEMI-PARALLEL LOW DENSITY PARITY CHECK DECODING USING A BLOCK STRUCTURED PARITY CHECK MATRIX

(75) Inventors: Predrag Radosavljevic, Houston, TX (US); Marjan Karkooti, Bryan, TX (US); Alexandre de Baynast, Aachen (DE); Joseph R. Cavallaro, Pearland, TX (US)

(73) Assignee: Core Wireless Licensing S.A.R.L., Luxembourg (LU)

( * ) Notice: Subject to any disclaimer, the term of this patent is extended or adjusted under 35 U.S.C. 154(b) by 280 days.

This patent is subject to a terminal disclaimer.

(21) Appl. No.: 13/479,745

(22) Filed: May 24, 2012

(65) Prior Publication Data

US 2012/0240003 A1   Sep. 20, 2012

Related U.S. Application Data

(63) Continuation of application No. 11/977,644, filed on Oct. 24, 2007, now Pat. No. 8,219,876.

(51) Int. Cl.
*H03M 13/00* (2006.01)
*G11C 29/00* (2006.01)
*H03M 13/11* (2006.01)

(52) U.S. Cl.
CPC ........ *H03M 13/1148* (2013.01); *H03M 13/114* (2013.01); *H03M 13/6566* (2013.01); *H03M 13/1137* (2013.01)

USPC .......................................... 714/758; 714/763

(58) Field of Classification Search
CPC .......... H03M 13/1137; H03M 13/114; H03M 13/1148; H03M 13/6566; H03M 13/6505
USPC .................. 714/757, 758, 763, 766
See application file for complete search history.

(56) References Cited

U.S. PATENT DOCUMENTS

| | | | |
|---|---|---|---|
| 7,549,105 B2 | 6/2009 | Shen et al. | 714/755 |
| 7,856,593 B2 | 12/2010 | Xin | 714/807 |
| 8,181,083 B2 * | 5/2012 | Rovini et al. | 714/758 |

(Continued)

OTHER PUBLICATIONS

Sang-Min Kim; Parhi, K.K., "Overlapped decoding for a class of quasi-cyclic LDPC codes," Signal Processing Systems, 2004. SIPS 2004. IEEE Workshop on , vol., No., pp. 113,117, Oct. 13-15, 2004.*

(Continued)

*Primary Examiner* — Cynthia Britt
(74) *Attorney, Agent, or Firm* — Winstead PC

(57) ABSTRACT

The invention relates to low density parity check decoding. A method for decoding an encoded data block is described. Encoded data block comprising data sub-blocks are stored. Decoding is performed in a pipelined manner using an irregular, block-structured parity check matrix, where at least two data sub-block matrices of the parity check matrix are read from and written in each of a plurality of clock cycles. The reading and writing of the data sub-blocks is evenly distributed between at least two area of a memory. The decoding is performed with shift values which eliminate cycles at or below a predetermined threshold length. An apparatus, computer program product and device are also described.

25 Claims, 10 Drawing Sheets

(56) References Cited

U.S. PATENT DOCUMENTS

| | | | |
|---|---|---|---|
| 8,214,717 B2* | 7/2012 | Oh et al. | 714/759 |
| 2008/0168324 A1 | 7/2008 | Xu et al. | 714/758 |
| 2009/0187804 A1 | 7/2009 | Shen et al. | 714/752 |
| 2011/0167315 A1 | 7/2011 | Kyung et al. | 714/752 |

OTHER PUBLICATIONS

A. Prabhakar, K. Narayanan, "Pseudorandom construction of low-density parity-check codes using linear congruential sequences", IEEE Transactions on Communications, vol. 50, Issue 9, pp. 1389-1396, Sep. 2002.

D. Hocevar, "A reduced complexity decoder architecture via layered decoding of LDPC codes," in SignalProcessing Systems SIPS 2004. IEEE Workshop on, pp. 107-112, Oct. 2004.

K.S. Kim, S.H. Lee, Y.H. Kim, J.Y. Ahn, "Design of binary LDPC code using cyclic shift matrices", Electronics Letters, vol. 40, Issue 5, pp. 325-326, Mar. 2004.

M. Mansour and N. Shanbhag, "High-throughput LDPC decoders," Very Large Scale Integration (VLSI) Systems, IEEE Transactions on, vol. 11, pp. 976-996, Dec. 2003.

P. Radosavljevic, A. de Baynast, and J. R. Cavallaro, "Optimized message passing schedules for LDPC decoding." 39th Asilomar Conference on Signals, Systems and Computers, Nov. 2005.

P.Radosavljevic, A de Baynast, M. Karkooti, and J. R. Cavallaro, "High-throughput multi-rate LDPC decoder based on architecture-oriented parity check matrices," in the 14th European Signal Processing Conference (EUSIPCO), Sep. 2006.

R.M. Tanner, "A recursive approach to low complexity codes"IEEE Transactions on Information Theory, vol. 27, pp. 533-547, Sep. 1981.

S. Chung, T. Richardson, and R. Urbanke, "Analysis of sum-product decoding of low-density parity-check codes using a Gaussian approximation," IEEE Trans. Inform. Theory, vol. 47, pp. 657-670, Feb. 2001.

T Richardson, A. Shokrollahi, and R. Urbanke, "Design of capacity approaching irregular low-density parity-check codes," IEEE Trans. Inform. Theory, vol. 47, pp. 619-637, Feb. 2001.

Gounai, S.; Ohtsuki T.;, "Lowering Error Floors of Irregular LDPC Code on Fast Fading Environment With and Without Perfect CSI," Vehicular Technology Conference, 2005. VTC 2005-Spring. 2005 IEEE 61st, vol. 1, No., pp. 634-638 vol. 1, May 30-Jun. 1, 2005.

Xiumei Yang; Dongfeng Yuan; Piming Ma; Mingyan Jiang;, New Research on Unequal Error Protection (UEP) property of Irregular LDPC Codes, Consumer Communications and Networking Conference, 2004.CCNC 2004. First IEEE, vol., No., pp. 361-363, Jan. 5-8, 2004.

\* cited by examiner $$\Pr(ABCD \in C_4) = \sum_{ijkl} \frac{i(i-1)j(j-1)k(k-1)l(l-1)\rho_i^2\lambda_j^2\rho_k^2\lambda_l^2}{\left(N_c\sum_n \lambda_n n\right)^4} \quad (1)$$

$$Av\_nb\_cycles\_of\_length\_4 = \Pr(ABCD \in C_4)\frac{(1-R)^2 N_c^2 (N_c-1)^2}{4} \quad (2)$$

$$\Pr(A_{ij} \in C_4) = \sum_{kl} \frac{(i-1)(j-1)k(k-1)l(l-1)\rho_i\lambda_j\rho_k^2\lambda_l^2}{\left(N_c\sum_n \lambda_n n\right)^3} \quad (3)$$

$$Av\_nb\_cycles\_of\_length\_4\_with\_A = \Pr(A_{ij} \in C_4)\frac{(1-R)(N_c-1)^2}{4} \quad (4)$$

$$\gcd((\alpha_1 - \alpha_2 + \alpha_3 - \alpha_4) \bmod S, S) \quad (5)$$

$$\frac{(1-R)(N_c-1)^2}{4}\sum_{kl} \frac{(i_{max}-1)(j_{max}-1)k(k-1)l(l-1)\rho_{i_{max}}\lambda_{j_{max}}\rho_k^2\lambda_l^2}{\left(N_c\sum_n \lambda_n n\right)^3} \quad (6)$$

$$\text{Latency} \approx \text{Max}(P,W)*L \text{ cycles} \quad (7)$$

FIG. 1

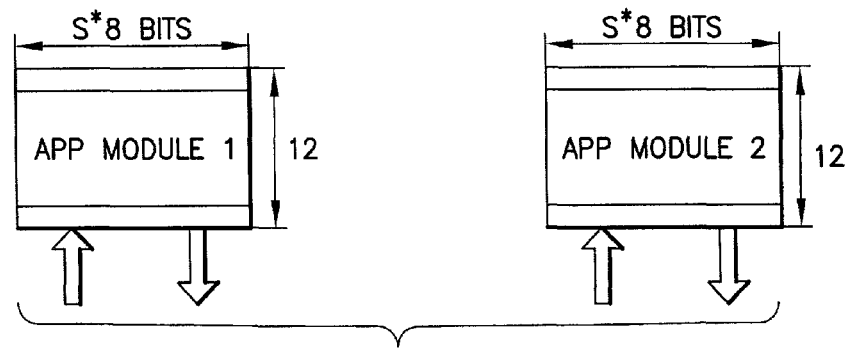
FIG.5
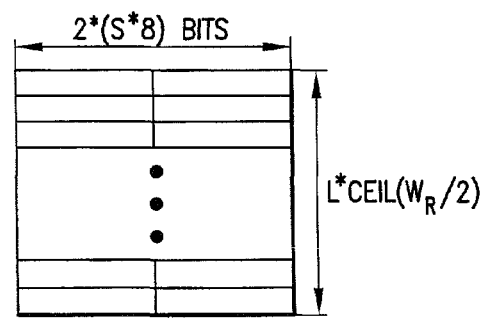
FIG.6
FIG.7

METHOD, APPARATUS, COMPUTER PROGRAM PRODUCT AND DEVICE PROVIDING SEMI-PARALLEL LOW DENSITY PARITY CHECK DECODING USING A BLOCK STRUCTURED PARITY CHECK MATRIX

CROSS-REFERENCE TO RELATED APPLICATIONS

This patent application is a continuing application of U.S. application Ser. No. 11/977,644, filed Oct. 24, 2007 now U.S. Pat. No. 8,219,876, the disclosure of which is incorporated by reference in its entirety.

TECHNICAL FIELD

The exemplary embodiments of this invention relate generally to wireless communication systems and, more specifically, relate to low density parity check decoding in wireless communication systems.

BACKGROUND

Certain abbreviations found in the description and/or in the figures are herewith defined as follows:
AN access node
APP a posteriori probability
ASIC application specific integrated circuit
BP belief propagation
DFU decoding function unit
DP data processor
DSPs digital signal processors
FEC forward error correction
FER frame error rate
FPGA field programmable gate array
LBP layered belief propagation
LDPC low density parity check
MEM memory
PCM parity check matrix
PROG program
RF radio frequency
RX receiver
SBP standard belief propagation
SNR signal to noise ratio
TRANS transceiver
TX transmitter
UE user equipment
WiMAX Worldwide Interoperability for Microwave Access In typical wireless communication systems hardware resources are limited (e.g., fully parallel architecture is not an acceptable solution because of the large area occupation on a chip, and small or no flexibility), therefore decoding based on LBP is applied. A major advantage of a LBP decoding algorithm in comparison with an SBP decoding algorithm is that the LBP decoding algorithm features a convergence that is approximately two times faster due to the optimized scheduling of reliability messages.

Decoding is performed in layers (e.g., set of independent rows of the PCM) where the APPs are improved from one layer to another. The decoding process in the next layer will start when APPs of the previous layer are updated.

See D. Hocevar, "A reduced complexity decoder architecture via layered decoding of LDPC codes," in Signal Processing Systems SIPS 2004. IEEE Workshop on, pp. 107-112, October 2004; M. Mansour and N. Shanbhag, "High-throughput LDPC decoders," Very Large Scale Integration (VLSI) Systems, IEEE Transactions on, vol. 11, pp. 976-996, December 2003; and P. Radosavljevic, A. de Baynast, and J. R. Cavallaro, "Optimized message passing schedules for LDPC decoding." 39th Asilomar Conference on Signals, Systems and Computers, November 2005.

In S. Chung, T. Richardson, and R. Urbanke, "Analysis of sum-product decoding of low-density parity-check codes using a Gaussian approximation," IEEE Trans. Inform. Theory, vol. 47, pp. 657-670, February 2001 an optimization of random PCMs was proposed. This optimization is equivalent to optimizing the profile of a random PCM. The profile is defined by two polynomials, $\rho(x)$ and $\lambda(x)$ which characterize the weight distribution of the columns and rows of the PCM, which is optimized through a density evolution analysis.

On the other hand, Mansour proposed an architecture-aware PCM design in order to achieve an acceptable trade-off between hardware resources and decoding throughput. The PCM is block-structured where each sub-block is a shift identity matrix. Only regular codes were considered and consequently bit/frame error rate performances are relatively poor. For further reference see: A. Prabhakar, K. Narayanan, "Pseudorandom construction of low-density parity-check codes using linear congruential sequences", IEEE Transactions on Communications, Volume 50, Issue 9, Page(s):1389-1396, September 2002.

In order to support the IEEE 802.11n wireless and WiMAX standards, LDPC decoders should achieve decoding throughput of about 1 Gbit/sec while using limited hardware parallelism (semi-parallel decoder). The decoder architecture needs to be scalable in order to support decoding of wide range of code rates and codeword sizes. Block structured parity check matrices with 24 sub-block columns are proposed in IEEE 802.11n standard and thus decoder architecture should support them.

While a fully parallel architecture with random PCM may achieve a high throughput, it suffers extremely large area occupation since the supported PCMs are not architecture-aware. Block-structured PCMs for semi-parallel architecture have been utilized in order to reduce the decoder area. However, for achieving Gigabits/s throughput, PCMs should be optimized with tighter architecture-aware constraints.

SUMMARY

An exemplary embodiment in accordance with this invention is a method for decoding an encoded data block. An encoded data block comprising data sub-blocks is stored. Decoding is performed in a pipelined manner using an irregular, block-structured parity check matrix. At least two sub-blocks matrices of the PCM can be read from and written in each of a plurality of clock cycles. The reading and writing of the data sub-blocks is evenly distributed between at least two areas of the memory. The decoding is performed with shift values which eliminate cycles at or below a predetermined threshold length.

A further exemplary embodiment in accordance with this invention is an apparatus for decoding an encoded data block. The apparatus has memory for storing an encoded data block comprising data sub-blocks. The apparatus has processors to decode the data block in a pipelined manner using an irregular, block-structured parity check matrix. At least two sub-block matrices of the PCM can be read from and written in each of a plurality of clock cycles. The reading and writing of the data sub-blocks is evenly distributed between at least two areas of the memory. The decoding is performed with shift values which eliminate cycles at or below a predetermined threshold length.

Another exemplary embodiment accordance with this invention is a computer readable medium tangibly embodied with a program of machine-readable instructions executable by a digital processing apparatus to perform operations for decoding an encoded data block. An encoded data block comprising data sub-blocks is stored. Decoding is performed in a pipelined manner using an irregular, block-structured parity check matrix. At least two sub-block matrices of the PCM can be read from and written in each of a plurality of clock cycles. The reading and writing of the data sub-blocks is evenly distributed between at least two areas of a memory. The decoding is performed with shift values which eliminate cycles at or below a predetermined threshold length.

A further exemplary embodiment in accordance with this invention is a device for decoding an encoded data block. The device has at least two means for storing an encoded data block comprising data sub-blocks. Additionally, the device has means for decoding the data block in a pipelined manner using a block-structured parity check matrix, where at least two sub-block matrices of the PCM can be read from and written in each of a plurality of clock cycles. The reading and writing of the data sub-blocks is evenly distributed between the at least two storing means. The decoding is performed with shift values which eliminate cycles at or below a predetermined threshold length.

BRIEF DESCRIPTION OF THE DRAWINGS

The foregoing and other aspects of embodiments of this invention are made more evident in the following Detailed Description, when read in conjunction with the attached Drawing Figures, wherein:

FIG. 1 shows equations (1) through (7).

FIG. 5 shows the organization of an APP memory in accordance with an embodiment of this invention.

FIG. 6 shows an implementation in accordance with an embodiment of this invention of ROM modules.

FIG. 7 shows an example of a check memory in accordance with an embodiment of this invention.

DETAILED DESCRIPTION

Embodiments in accordance with this invention overcome the problems associated with architecture-aware PCMs while keeping the same error-correcting capability as with random PCMs. Such embodiments may enable a semi-parallel decoder architecture to achieve an average decoding throughput of approximately 1 Gbits/s.

Embodiments in accordance with this invention incorporate architecture-aware block-structured PCMs. These PCMs, suitable for implementation in area efficient semi-parallel LDPC decoders, enable high decoding throughput (e.g., above 1 Gbits/s) without sacrificing error correcting capabilities. The PCMs may incorporate several architecture-aware constraints, such as: a minimal size of the sub-block matrices (e.g., shifted identity matrices), a limited set of shift values for area efficient decoder design, an equally distributed odd/even non-zero block columns per layer for a memory throughput increase, and an upper triangular structure of the redundant part for linear encoding (e.g., only having non-zero elements along the diagonal and above it).

In order to have capacity-approaching performance, the shift values of the non-zero sub-matrices may be optimized to limit the number of short-length cycles (e.g., cycles of length 4, 6 and 8). Furthermore, the code profile may be optimized through density evolution analysis by explicitly considering the block structure of the PCM.

Figure 2:
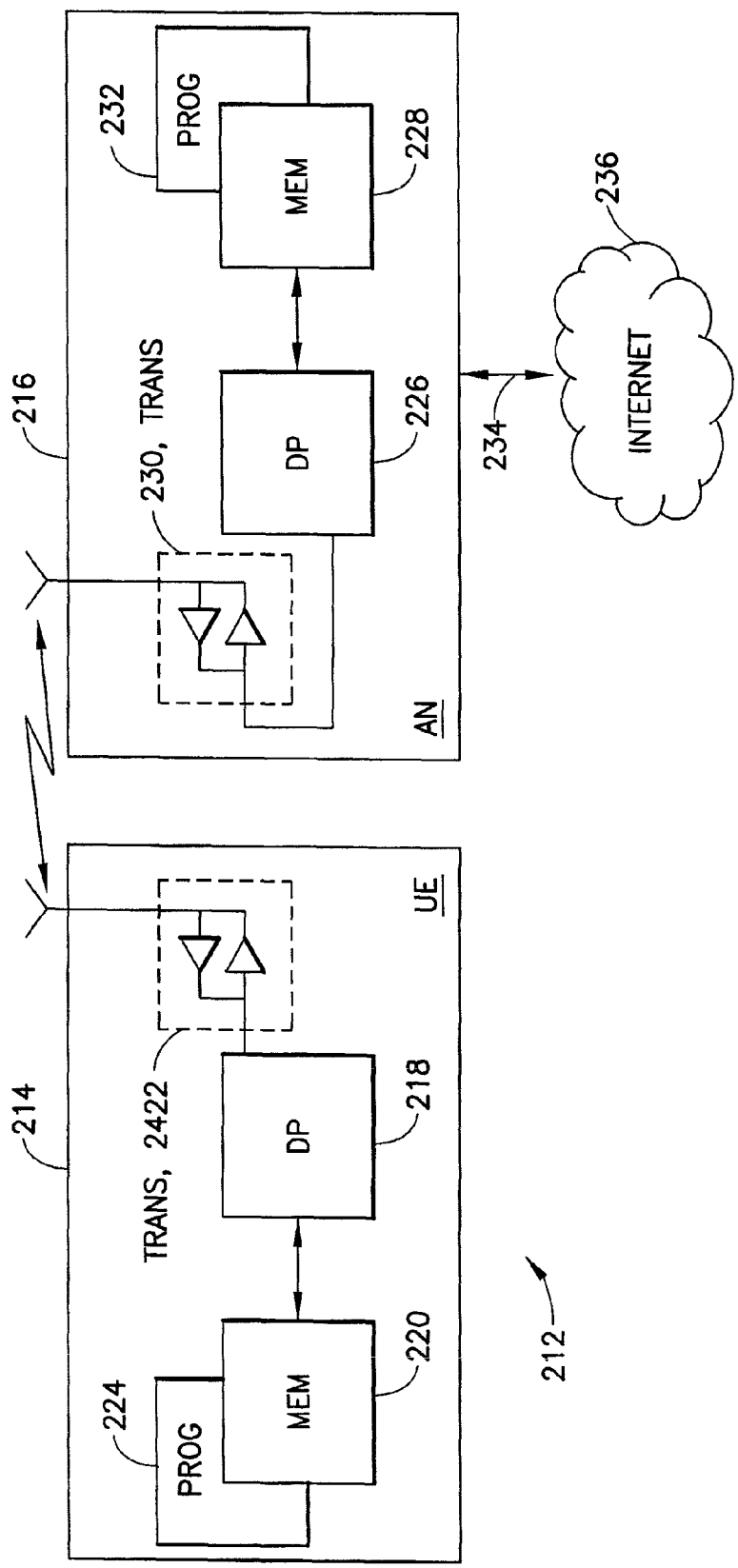
FIG. 2 shows a simplified block diagram of various electronic devices that are suitable for use in practicing the exemplary embodiments of this invention.

Reference is made to FIG. 2 for illustrating a simplified block diagram of various electronic devices that are suitable for use in practicing the exemplary embodiments of this invention. In FIG. 2, a wireless network 212 is adapted for communication with a user equipment (UE) 214 via an access node (AN) 216. The UE 214 includes a data processor (DP) 218, a memory (MEM) 220 coupled to the DP 218, and a suitable RF transceiver (TRANS) 222 (having a transmitter (TX) and a receiver (RX)) coupled to the DP 218. The MEM 2420 stores a program (PROG) 224. The TRANS 222 is for bidirectional wireless communications with the AN 216. Note that the TRANS 222 has at least one antenna to facilitate communication.

The AN 216 includes a DP 226, a MEM 228 coupled to the DP 226, and a suitable RF TRANS 230 (having a TX and a RX) coupled to the DP 226. The MEM 228 stores a PROG 232. The TRANS 230 is for bidirectional wireless communications with the UE 214. Note that the TRANS 230 has at least one antenna to facilitate communication. The AN 216 is coupled via a data path 234 to one or more external networks or systems, such as the internet 236, for example.

At least one of the PROGs 224, 232 is assumed to include program instructions that, when executed by the associated DP, enable the electronic device to operate in accordance with the exemplary embodiments of this invention, as discussed herein.

In general, the various embodiments of the UE 214 can include, but are not limited to, cellular phones, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, as well as portable units or terminals that incorporate combinations of such functions.

The embodiments of this invention may be implemented by computer software executable by one or more of the DPs 218, 226 of the UE 214 and the AN 216, or by hardware, or by a combination of software and hardware.

The MEMs 220, 228 may be of any type suitable to the local technical environment and may be implemented using any suitable data storage technology, such as semiconductor based memory devices, magnetic memory devices and systems, optical memory devices and systems, fixed memory and removable memory, as non-limiting examples. The DPs 218, 226 may be of any type suitable to the local technical environment, and may include one or more of general purpose computers, special purpose computers, microprocessors, digital signal processors (DSPs) and processors based on a multi core processor architecture, as non limiting examples.

The exemplary embodiments of the invention, as discussed above and as particularly described with respect to exemplary methods, may be implemented as a computer program product comprising program instructions embodied on a tangible computer-readable medium. Execution of the program instructions results in operations comprising steps of utilizing the exemplary embodiments or steps of the method.

In general, the various embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

Block-structured irregular PCMs are suitable for implementation in a semi-parallel LDPC decoder with high decoding throughput (e.g., an average throughput above 1 Gbits/s) while keeping the same error-correcting performance as with random PCMs.

The PCMs may be designed with architecture-aware constraints, such as:

a) A limited set of shift values in the sub-block matrices is used in order to reduce the permuter size while avoiding the presence of short cycles and to allow area efficient decoder design.

b) Equally distributed odd/even non-zeros block columns per layer may be used in order to increase memory throughput. The throughput is substantially increased by enabling simultaneously reading/writing the reliability messages from the two sub-blocks of the PCM. Memory access conflicts are avoided when the PCM is designed such that it is possible to store all messages into two independent memory modules. For example, all messages that belong to odd block columns are stored in one memory module and all messages from even block columns are stored in another module.

The shift values (e.g., from a reduced set of possible values) may be optimized by minimizing a new cost function to eliminate/reduce the number of cycles of short length (e.g., cycles of length 4, 6 and 8).

The PCM profile may be optimized through a density evolution analysis by explicitly considering the block structure of the PCM. Such a profile is slightly different from a profile obtained with random matrices. Since the density evolution analysis does not depend on the shift values, this optimization is greatly simplified.

A PCM design in accordance with an embodiment of this invention does not change the convergence speed of the LDPC decoding. High parallelism degree can be achieved with such LDPC codes without any performance loss. This parallelism degree is higher than the parallelism achieved with Turbo-codes.

Architecture-aware optimization of the LDPC codes results in block-structured PCMs suitable for semi-parallel high throughput decoder design. A decoder in accordance to an embodiment of this invention can be initially implemented on a FPGA (e.g., using Xilinx System Generator design tool) for fast prototyping and functional verification. The targeting high throughput LDPC decoder may also be designed as an ASIC solution. Higher throughput (ASIC can provide a fast clock speed) and significantly smaller gate count and power dissipation can be achieved compare to the FPGA implementation. Fixed-point implementation may be used for the decoder design. The arithmetic precision may be either 7 or 8 bits, depending on the acceptable performance loss comparing to the error-rate performance of a floating-point implementation.

A code optimization strategy in accordance to an embodiment of this invention results in block-structured PCMs that are compatible with IEEE 802.11n and WiMAX standards. The block-structured PCMs represent a good alternative solution to increase throughput of these standards.

A PCM design in accordance with an embodiment of this invention provides many benefits, including architecture-aware optimization of the LDPC codes. Block-structure PCMs are suitable for architecture-efficient semi-parallel high throughput decoders. Such PCMs also incorporate excellent error-correcting capabilities. The number of short cycles may be significantly reduced enabling error-correction performance comparable with random PCMs. Such a PCM allows read/write of two sub-blocks of APP messages in a single clock cycle without a memory conflict. Area efficiency may be provided by a limited set of possible shift values in the seed PCMs. This allows significantly simpler permuter design.

A random PCM may be described by two polynomials $\lambda(x)$ and $\rho(x)$. Following the columns, $\lambda_i$ describes the fraction of edges connected to a bit node of degree i, and following the rows, $\rho_i$ describes the fraction of edges connected to a check node of degree i. Random PCMs have excellent asymptotic performance but there is a lack of parallelism, and complex memory access is used. Thus a random PCM may not be used easily in practice. See: T. Richardson, A. Shokrollahi, and R. Urbanke, "Design of capacity approaching irregular low-density parity-check codes," IEEE Trans. Inform. Theory, vol. 47, pp. 619-637, February 2001.

Block-structured PCMs may be defined by a profile, such as: two polynomials, $\lambda'(x)$ and $\rho'(x)$, and a seed matrix $H_{seed}$, containing the non-zero shift values of the sub-blocks. See: R. M. Tanner, "A recursive approach to low complexity codes" IEEE Transactions on Information Theory, vol. 27, pp. 533-547, September 1981., and A. Prabhakar, K. Narayanan, "Pseudorandom construction of low-density parity-check codes using linear congruential sequences", IEEE Transactions on Communications, Volume 50, Issue 9, pp. 1389-1396, September 2002

Block structured PCMs provide high decoding throughput due to a certain level of parallelism degree. They also enable near optimal asymptotic performance. See: P. Radosavljevic, A de Baynast, M. Karkooti, and J. R. Cavallaro, "High-throughput multi-rate LDPC decoder based on architecture-oriented parity check matrices," in the 14th European Signal Processing Conference (EUSIPCO), September 2006.

When generating the block-structured PCM, shift values may be optimized to reduce the number of short cycles, e.g., the cycles of length 4, 6 and 8 within the PCM. Reducing the number of these cycles significantly lowers the error floor in FER performance curves and enhances the convergence speed of the decoding. Proper code design provides good error-rate performance for short and moderate codeword sizes (e.g., 1000-3000 bits). Additionally, the $H_{seed}$ may be optimized by performing a density evolution analysis on the block-structured PCM. A PCMs in accordance with an embodiment of this invention does not have any cycle of length 4 and has more than 40% less cycles of length 6 in comparison with random construction. See: P. Radosavljevic, A de Baynast, M. Karkooti, and J. R. Cavallaro, "High-throughput multi-rate LDPC decoder based on architecture-oriented parity check matrices," in the 14th European Signal Processing Conference (EUSIPCO), September 2006.

For a given rate R and codeword size N, the number of sub-blocks Nc is given as Nc=N/S, with S×S sub-blocks. The number of sub-blocks must be carefully considered. A larger number of sub-blocks provides a better profile. However, a smaller number of sub-blocks enables easier removal of short cycles and higher throughput due to a higher parallelism degree. Balancing these factors enables selecting a suitable sub-block size for given codeword size and targeting throughput.

For any distinct elements A,B,C and D of $H_{seed}$, the probability that there is a cycle of length 4, $C_4$, in A,B,C,D is given by equation (1) as shown in FIG. 1. The average number of cycles of length 4 in $H_{seed}$ may be expressed as equation (2) as shown in FIG. 1. The probability that A belongs to a cycle of length 4 is given by equation (3) as shown in FIG. 1. The average number of cycles of length 4 including A can be expressed equation (4) as shown in FIG. 1.

See P. Radosavljevic, A de Baynast, M. Karkooti, and J. R. Cavallaro, "High-throughput multi-rate LDPC decoder based on architecture-oriented parity check matrices," in the 14th European Signal Processing Conference (EUSIPCO), September 2006.

The number of cycles in the full PCM matrix is given by equation (5) as shown in FIG. 1. $\{\alpha_1,\alpha_2,\alpha_3,\alpha_4\}$ denote the shift values in the cycle ABCD of $H_{seed}$. See: K. S. Kim, S. H. Lee, Y. H. Kim, J. Y. Ahn, "Design of binary LDPC code using cyclic shift matrices", Electronics Letters, Volume 40, Issue 5, pp. 325-326, March 2004

The total number of shift values should be at least equal to (6) as shown in FIG. 1. This enables removing all cycles of length 4 in the PCM. See: P. Radosavljevic, A de Baynast, M. Karkooti, and J. R. Cavallaro, "High-throughput multi-rate LDPC decoder based on architecture-oriented parity check matrices," in the 14th European Signal Processing Conference (EUSIPCO), September 2006.

The $H_{seed}$ may be optimized by performing a density evolution analysis on the block-structured PCM. For a standard density evolution analysis, the profile may be given by two polynomials $\lambda(x)$ and $\rho(x)$, where $\lambda_i$ is the proportion of edges connected to bit nodes of degree i, and $\rho_j$ is the proportion of edges connected to check nodes of degree j. This can be extended so that $\lambda_{i,j}$ is the proportion of edges connected between bit node of degree i and check node of degree j. The same density evolution equation may be used for random and block structured codes.

Figure 3:
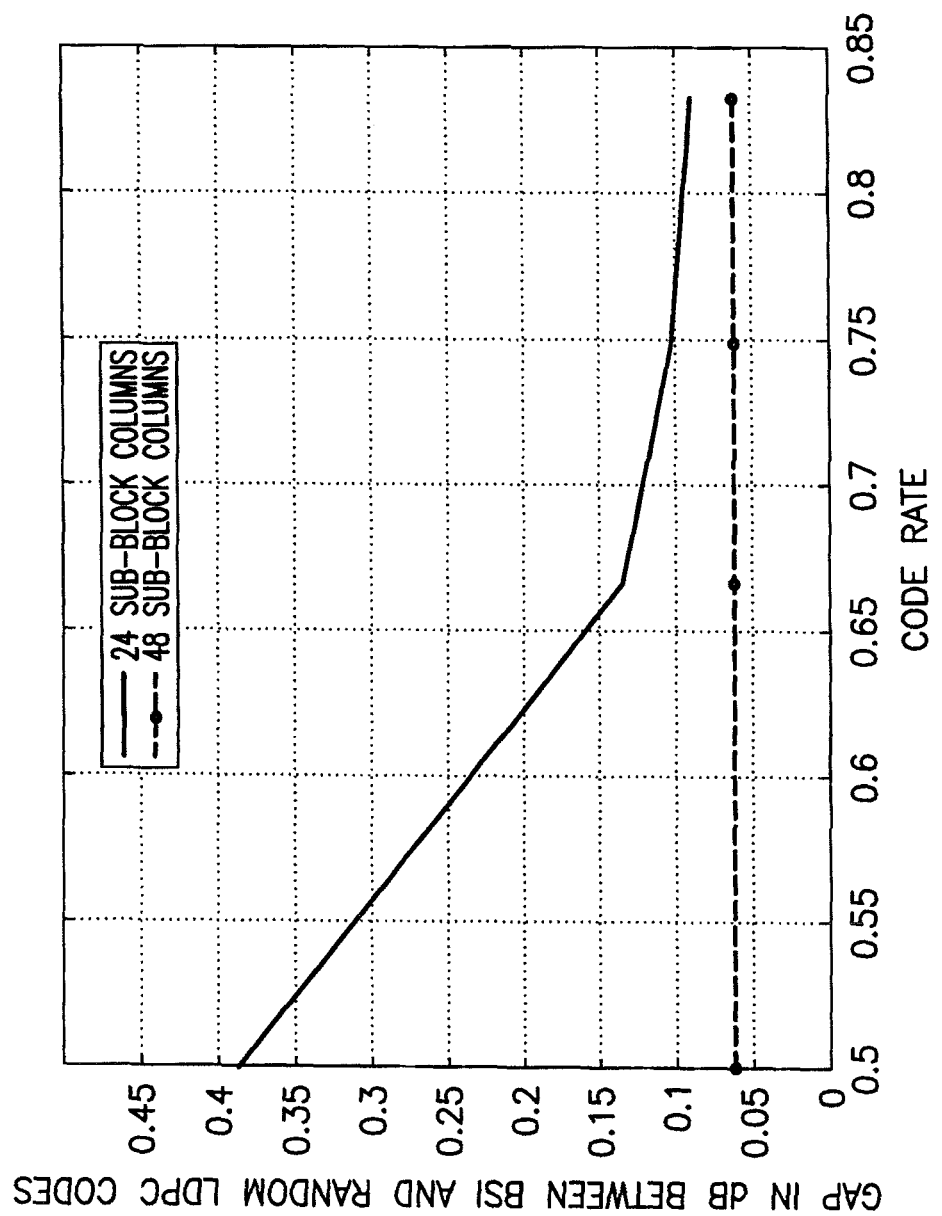
FIG. 3 shows an illustration of the gap in dB between block-structure codes and random LDPC codes for a given code rate.

FIG. 3 shows the gap in dB between block-structured codes and random LDPC codes for a given code rate. The graph illustrates an error-rate performance loss of less than 0.4 dB for PCMs with 24 sub-block-columns and an error-rate performance loss of less than 0.07 dB for PCMs with 48 sub-block-columns.

Equations (4) and (5) may be extended to any cycle length (e.g., 6, 8). Using equation (6), it is possible to determine the minimal number of shift values necessary to remove all cycles of length 4.

A density evolution algorithm may be extended to take into account the block-structure of the code. The architecture-aware optimization constraints allow upper triangular structure of the PCM's redundant part for the purpose of simplified encoding, as well as the equally distributed odd and even non-zero block-column positions in the information part for a memory throughput increase.

A LDPC in accordance with an embodiment of this invention may support a block-structured PCMs with architecture-aware constraints. High decoding throughput may be realized due to the special structure of the PCM that allows reading/writing of APP and check messages from two sub-block matrices per clock cycle and by pipelining of three PCM layers. An area-efficient semi-parallel decoder implementation utilizes reduced-sized permuters due to a limited set of shift values in the PCM, as well as enabling full processing parallelism per one layer.

Figure 4:
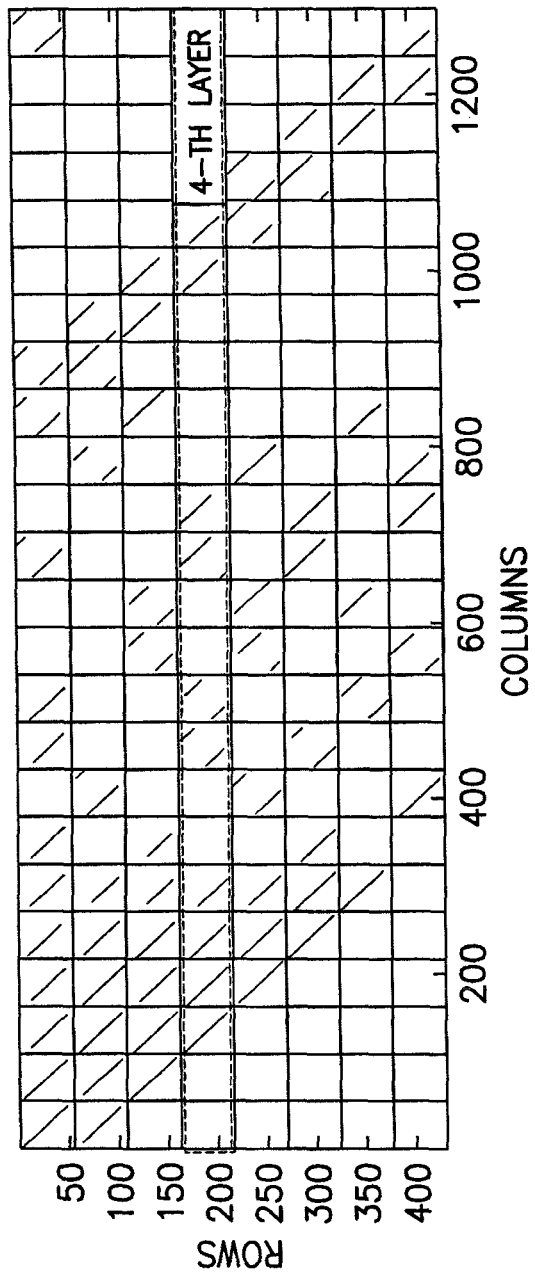
FIG. 4 shows a block structured irregular parity-check matrix.

The memory may be separated into 24 block-columns in two APP memory modules. The pair of APP block-columns may be read/written in every clock cycle. This allows reading/writing two APP block-columns in every clock cycle without memory conflict FIG. 4 shows a typical block-structured PCM with a rate of 2/3.

FIGS. 5, 6 and 7 describe the memory organization of a LDPC decoder in accordance with an embodiment of this invention. In these examples one read and one write memory port are used.

FIG. 5 shows the organization of an APP memory which is divided into two sub-modules. In each memory module one half of the PCM block-columns can be stored (e.g., either odd or even block-columns).

Each module may have 12 block-columns and thus a depth of 12. The number of APP messages in one block-column is given by S, the width of the block column. Two-s complement may be used for fixed-point representation of reliability messages (APP messages and check messages). Any fixed-point arithmetic precision can be supported.

FIG. 6 shows an implementation in accordance with this invention of ROM modules that contain non-zero positions and shift values (e.g., original or relative values) of successively read/written APP block-columns.

Each of two ROM modules is dedicated for one particular APP module. The modules provide positions of non-zero block-columns (e.g., from 1 to 24) as well as the shift value of the corresponding identity matrix. The block column's position is the next reading/writing address of APP memory modules.

Two additional ROM modules may be used. These modules can store relative shift values instead of original shift values. The relative shift values provide the relative difference to the previous shift value of the same block-column. The original shift values are used in the first iteration. This prevents permutation of APP messages before memory writing.

Block-structured PCMs may have equally distributed odd and even non-zero block-column positions. This allows one module to contain APP messages from odd block-columns and a second module to contain APP messages from even block-columns.

FIG. 7 shows the organization of check memory. One check memory location may contain messages from two consecutive block-matrices.

Organization of check memory doesn't depend on the order of reading/writing of APP block-columns. It is initialized with all zeros; consequently the check message position is not related to the particular block-column. A check memory location may contain messages from two non-zero sub-matrices. In some implementations the check memory may be divided into sub-modules, which facilitates the scalability of the decoder and provides support for variable codeword sizes.

Figure 8:
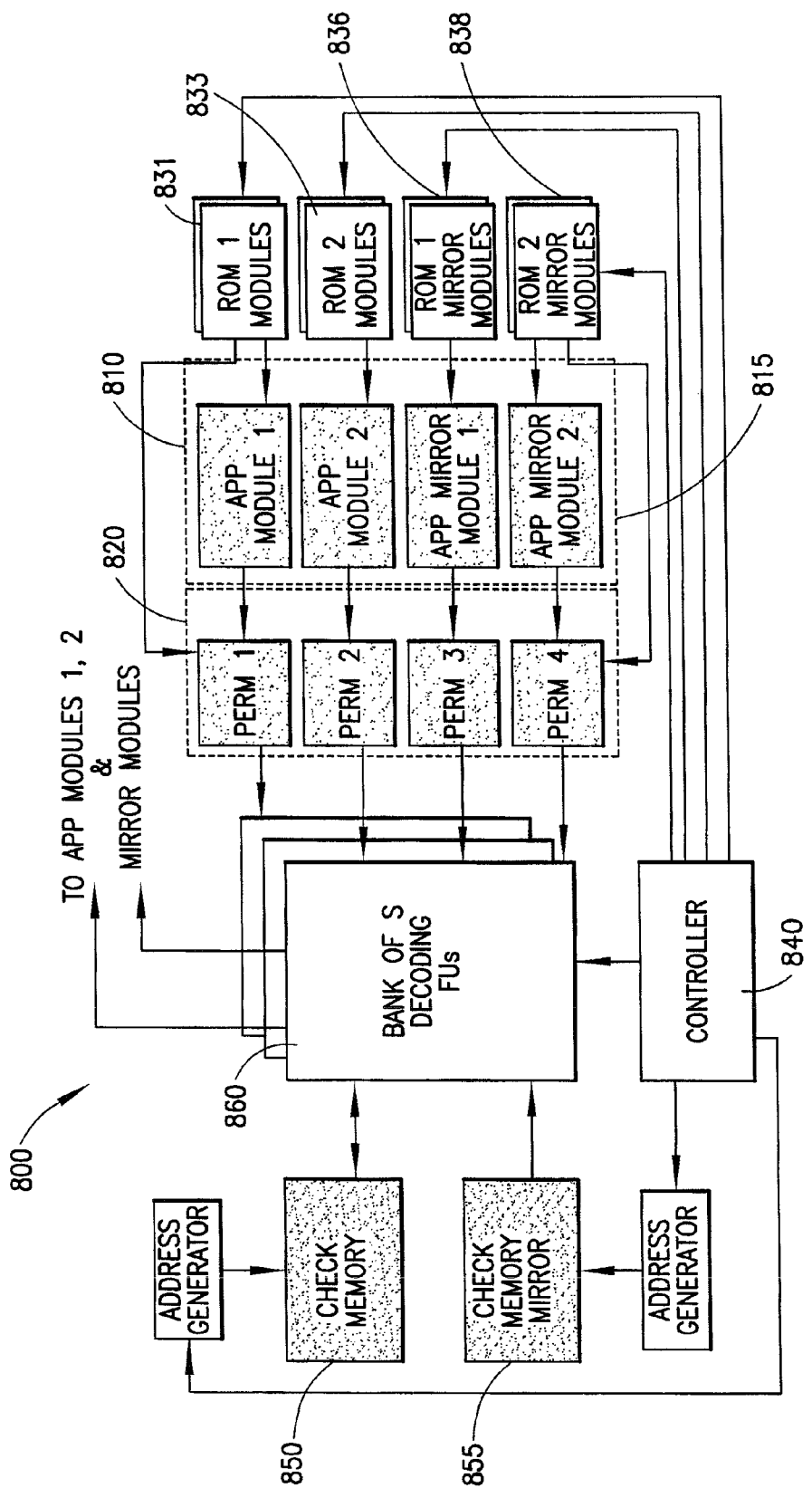
FIG. 8 illustrates a block diagram of a LDPC decoder in accordance with an embodiment of this invention.
Figure 9:
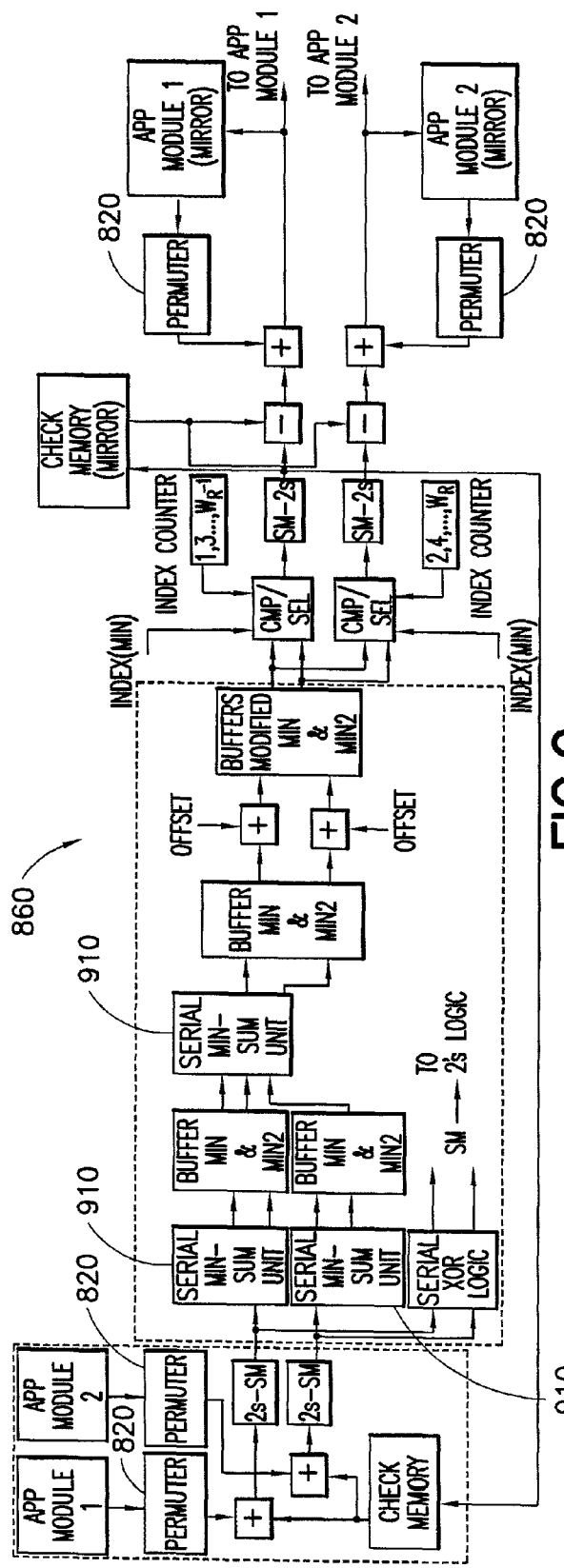
FIG. 9 shows illustrates a block diagram of a DFU in accordance with an embodiment of this invention.
Figure 10:
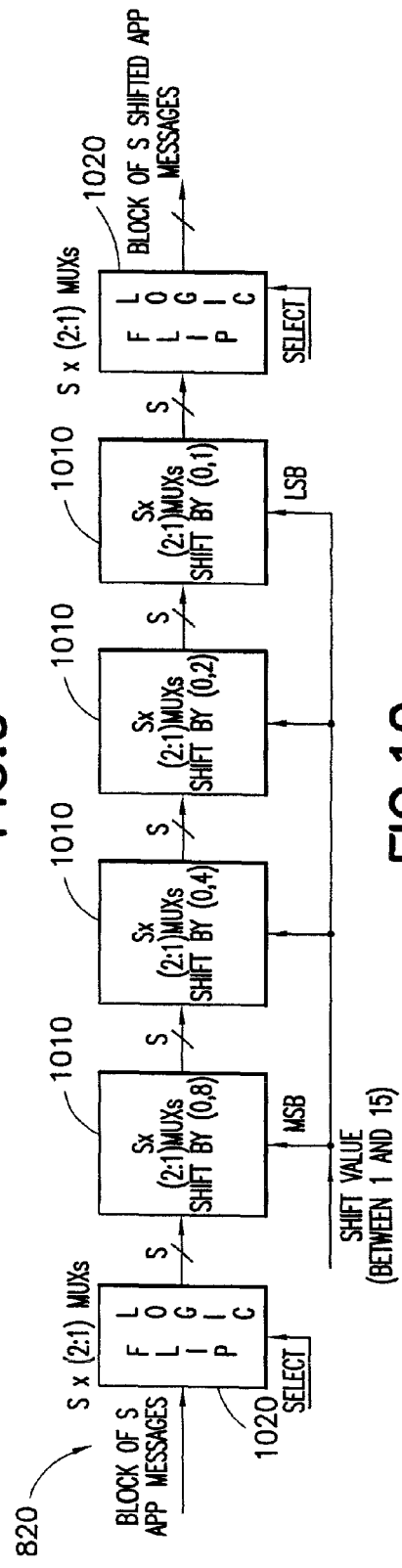
FIG. 10 illustrates a block diagram of a reduced permuter in accordance with an embodiment of this invention.

FIGS. 8, 9, and 10 show detailed block diagrams of a high-throughput LDPC decoder, a decoding function unit, and a reduced permuter, all in accordance with an embodiment of this invention.

FIG. 8 shows a block diagram of a LDPC decoder 800 in accordance with an embodiment of this invention. Such a decoder can utilize hardware resources, such as: S decoding function units 860, used to achieve full decoding parallelism per one layer where there are S rows in the layer; two check memories 850 and 855 (e.g., a mirror 855 used to facilitate the pipelining of layers), four APP modules 810 and 815, including APP mirror memory 815, and permuters 820 used for block shifting of APP messages after reading from memory.

A controller 840 provides control logic which controls the addressing of check memory 850 and 855, as well as addressing of ROM modules 831, 833, 836 and 838 (used for addressing of APP memory modules and determining the shift values for permutation) and processing inside S parallel DFUs 860. When the row connectivity degree $W_R$ is odd, one block-column per clock cycle can be read/written from/to APP modules 810 and 815. The read/write may be scheduled to be last in the layer (e.g., last clock cycle). Two sub-blocks of check messages may be automatically read/written from/to check memory 850 and 855, but the second half of the check memory location may not be valid. Therefore, the control logic in the controller 840 may disable some arithmetic FUs inside the DFUs 860 and two out of the four permuters 820. Both ROM1 831 and 836 and ROM2 833 and 838 may be fully read at the end of one decoding iteration. Additional ROM, not shown, may be used to store the value of $W_R$ for each layer.

Such a permuter 820 does not use reverse permutation before writing of APP messages. Also, the permuter 820 has a total latency of three clock cycles due to the pipeline stages, where two stages of S 2:1 MUXs determine one pipeline stage.

FIG. 9 shows a block diagram of a DFU 860 in accordance with an embodiment of this invention. This illustrates an implementation of three pipeline stages (reading, processing, and writing stages) used for decoding of one PCM row. Rows within the three consecutive layers can be simultaneously decoded. In every clock cycle two APP messages and two check messages are loaded into single DFU, and in every clock cycle two check messages and two APP messages are updated. The DFU 860 supports reading/writing of two sub-block matrices (blocks of APP and check messages) per clock cycle. Three pipeline stages are allowed: reading, processing, and writing stages. Min-sum approximation (e.g., serial search for two smallest messages) may be implemented using serial min-sum function units 910.

FIG. 10 shows a permuter 820 in accordance with an embodiment of this invention. The seed matrix for the block-structured PCMs has limited sets of shift values (e.g., from 1 to 15). The permuter 820 has 4 stages of 2:1 MUXs 1010. Two additional stages of "flip-logic" (S×2:1 MUXs 1020) perform block-shifting in both directions (e.g., where the relative offset is either between 1 and 15, or between −15 and −1). The additional "flip-logic" in input and output stages is used to support block shifting in both left and right directions. Such logic reverses the order of APP messages: the first message becomes the Sth message, the second message becomes the (S−1)th, etc., for the input "flip-logic", and vice-versa for the output "flip-logic". This logic may be utilized if the relative shifting offset is negative (e.g., between −15 and −1).

The number of standard ASIC gates for arithmetic part of decoder 800, which includes the DFUs 860 and permuters 820, may be estimated. In a non-limiting example, using a codeword size of 1944 bits (therefore S is 81) and 8-bit two-s complement fixed-point arithmetic precision, the total number of gates is approximately 235 KGates. This is only an almost 1.46 increase in area to support reading/writing two block-matrices per clock cycle. The 81 DFUs are equivalent to 189 KGates, where 96 KGates are used for processing two block-matrices. Each of four reduced permuters has approximately 11.6 KGates, compared to a typical permuter of 33.6 KGates. The reduced permuters provide a significant reduction of area when all shift values up to 80 are supported. It should be appreciated that a decoder in accordance with an embodiment of this invention can support any two-s complement fixed-point arithmetic precision.

High decoding throughput (e.g., approximately 1 GBits/sec in average) may be achieved with limited hardware resources using semi-parallel architecture. High throughput is provided by: reading/writing two sub-block matrices (e.g., blocks of APP and check messages) in every clock cycle; full processing parallelism per one layer of PCM; and pipelining of three consecutive layers.

Data throughput is based on decoding latency per iteration. The three pipeline stages have their own latency: reading latency (R) of $W_R/2+5$ clock cycles; processing latency (P) of $W_R/2+6$ clock cycles; and writing latency (W) of $W_R/2+4$ clock cycles. Due to the pipelining of layers the decoding latency per iteration can be determined as a maximum latency of processing and writing stages, as shown in equation (7), where L is the total number of layers. The reading latency does not impact the overall latency because it is overlapped with the processing/writing latency.

Figure 11:
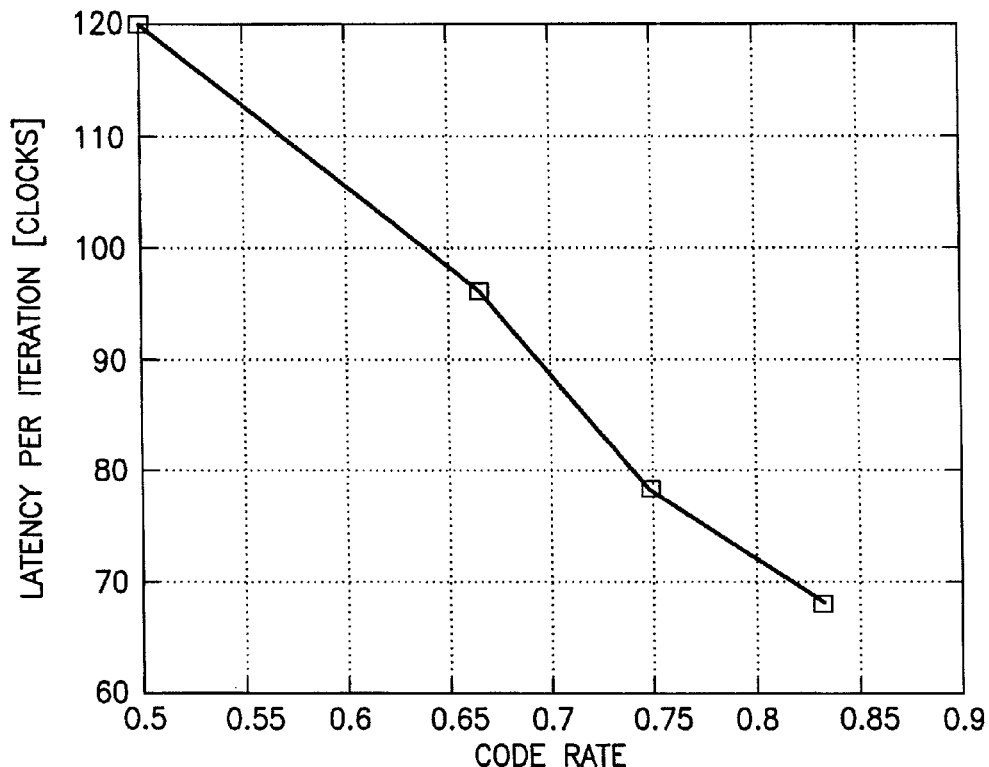
FIG. 11 shows processing latency per decoding iteration in clock cycles for different code rates.

In effect, the processing latency, P, and the number of layers in the PCM determine the latency per iteration. The processing latency is always larger than the writing latency. Because of the full decoding parallelism per layer, the decoding latency per iteration does not depend on the codeword size, and by extension, on the number of rows per layer. The decoding latency per iteration depends on the code rate. This is illustrated in FIG. 11.

Figure 12:
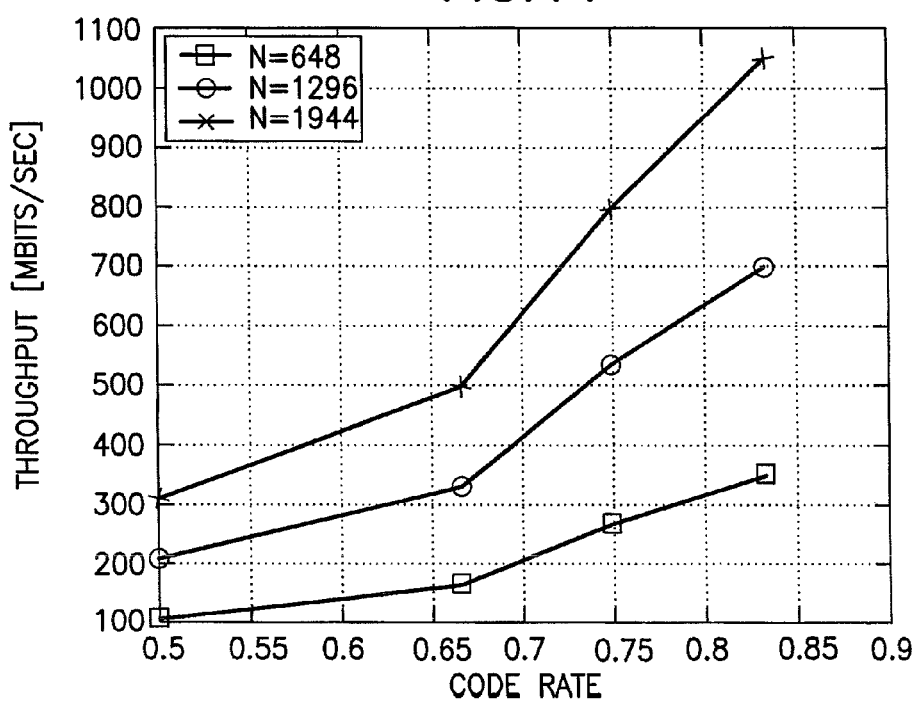
FIG. 12 shows an illustration of decoding throughput vs. code rate for a number of codeword lengths.

The average decoding throughput is based on the average number of iterations to achieve a FER of $10^{-4}$ (where the maximum number of decoding iterations is set to 15). The average number of iterations also depends on the codeword size and code rate; this may typically be around five iterations. Using a 200 MHz clock frequency, the average throughput is increased approximately 1.54 times comparing to a decoder that supports reading/writing of one block-matrix per clock cycle. See FIG. 12 for an illustration of throughput vs. code rate for a number of codeword lengths.

Figure 13:
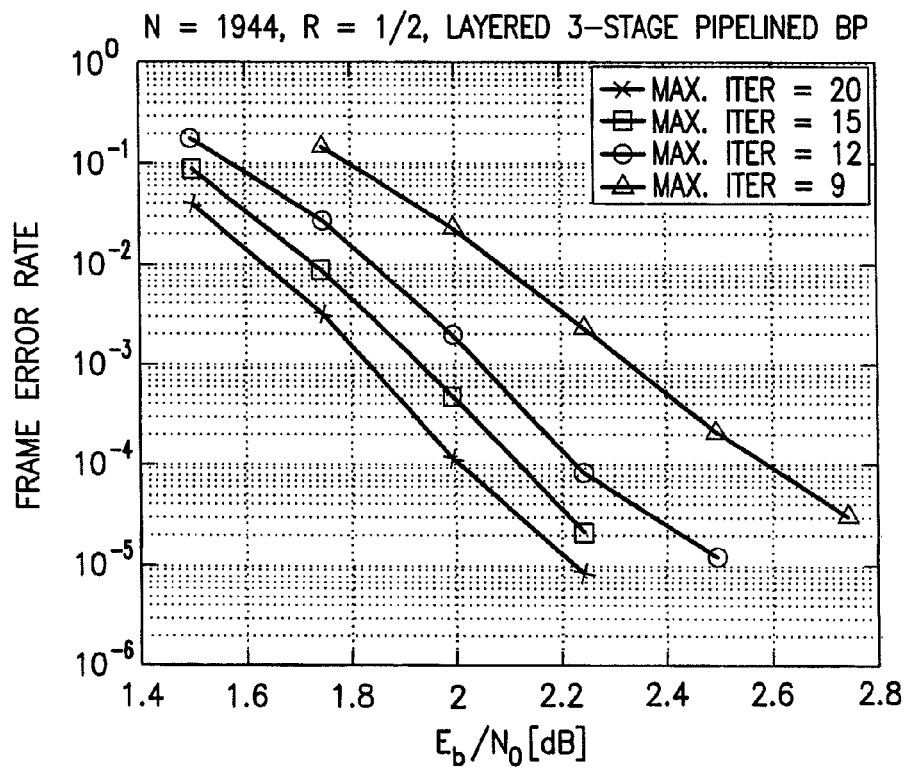
FIG. 13 shows an illustration of FER vs. SNR for different maximum number of iterations, code size 1944, code rate 1/2.
Figure 14:
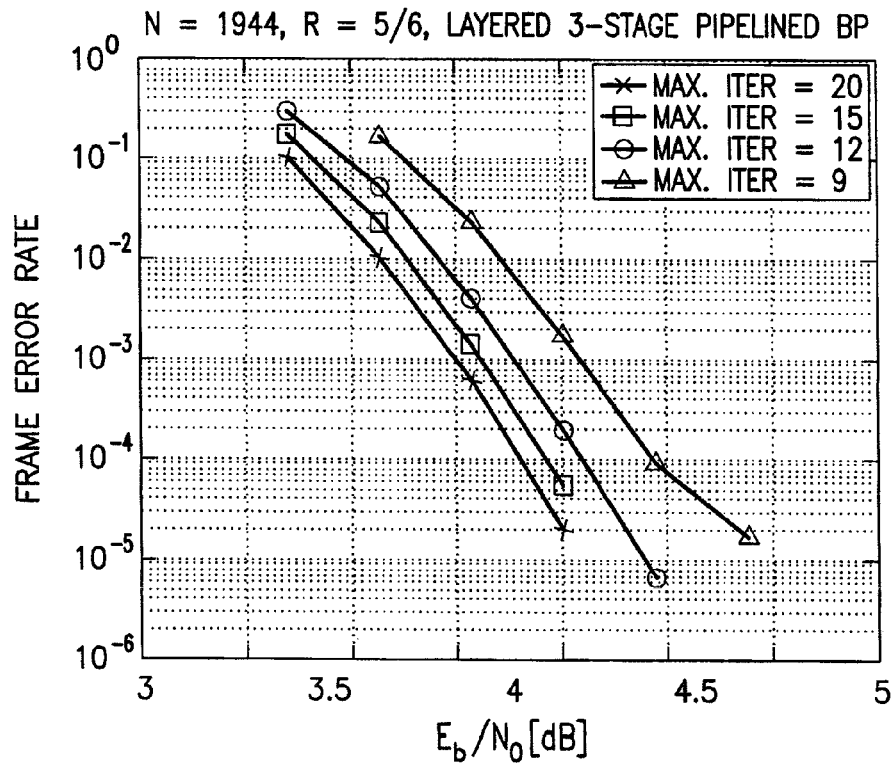
FIG. 14 shows an illustration of FER vs. SNR for different maximum number of iterations, code size 1944, code rate 5/6.

FIGS. 13 and 14 show FER performance vs. SNR for different pre-determined maximum number of decoding iterations. The maximum number of decoding iterations depends upon a number of factors, e.g., SNR, desired FER, etc. FIG. 13 illustrates an example where the code rate is 1/2. FIG. 14 illustrates an example where the code rate is 5/6.

Figure 15:
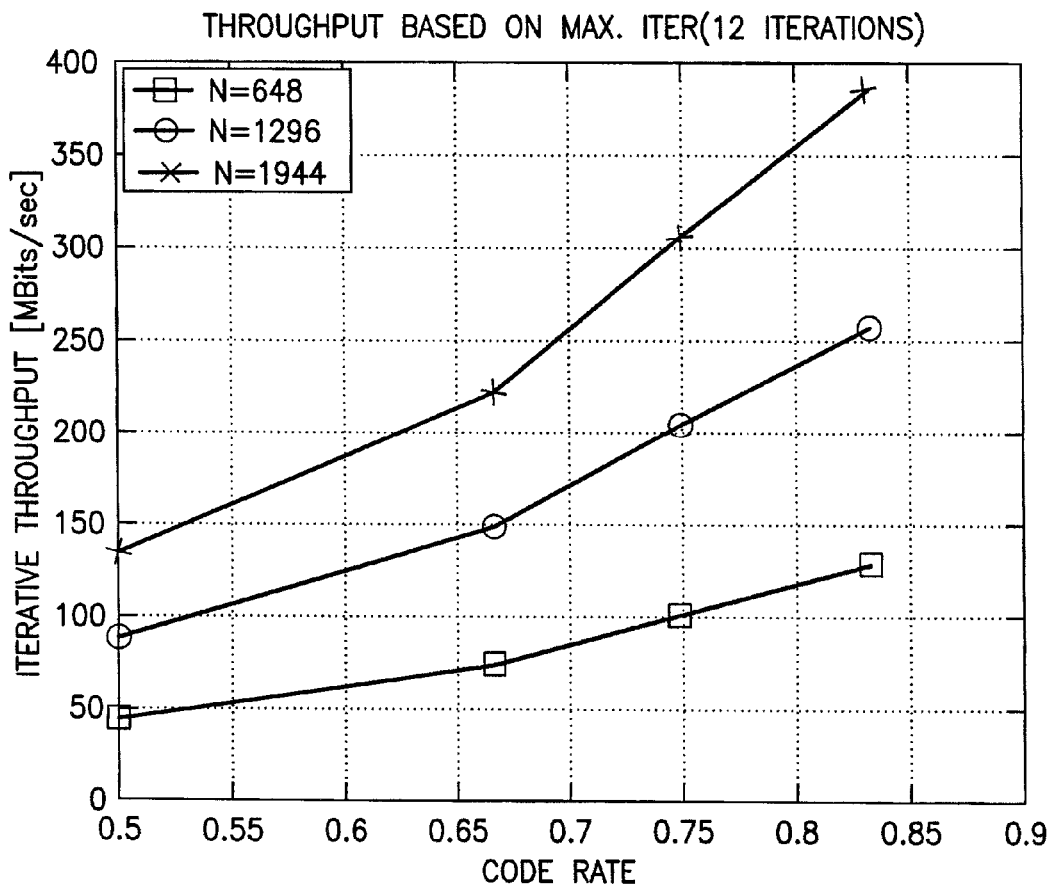
FIG. 15 shows an illustration of a minimum achievable throughput for a pre-determined number of iterations.

FIG. 15 illustrates an example of a minimum achievable throughput for a pre-determined maximum number of decoding iterations. In this example, the maximum number of decoding iterations was set to twelve.

A decoder in accordance with an embodiment of this invention provides a reduction/removal of short cycles by using a limited set of shift values. This reduction/removal is performed with only a marginal loss in error rate performance when compared to a fully random PCM structure. Furthermore, such a decoder may use equally distributed odd and even non-zero block-columns per layer. No APP memory access conflict occurs due to two sub-columns being read/written from/to memory modules per cycle. Such a LDPC decoder provides a throughput increase with limited hardware overhead.

Figure 16:
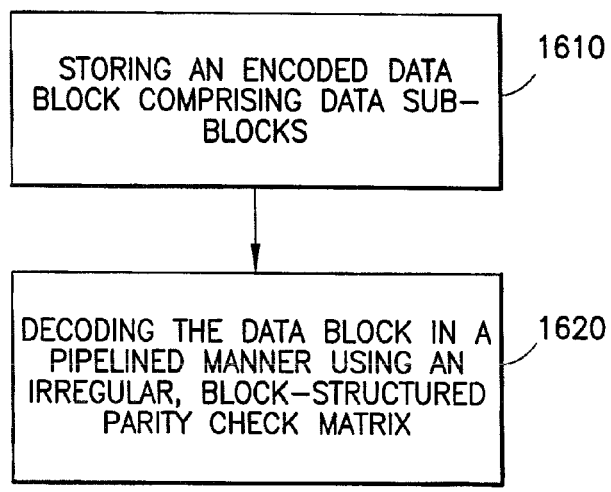
FIG. 16 illustrates a method in accordance with an embodiment of this invention.

FIG. 16 shows a method for decoding an encoded data block in accordance with an embodiment of this invention. In step 1610 an encoded data block comprising data sub-blocks is stored. Decoding is performed in a pipelined manner using an irregular, block-structured parity check matrix in step 1620. At least two sub-blocks matrices of the PCM can be read from and written in each of a plurality of clock cycles. The reading and writing of the data sub-blocks is evenly distributed between at least two memory modules. The decoding is performed with shift values which eliminate cycles at or below a predetermined threshold length.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

The foregoing description has provided by way of exemplary and non-limiting examples a full and informative description of the invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention.

Furthermore, some of the features of the preferred embodiments of this invention could be used to advantage without the corresponding use of other features. As such, the foregoing description should be considered as merely illustrative of the principles of the invention, and not in limitation thereof.

What is claimed is:

1. A method comprising:
   storing an encoded data block comprising data sub-blocks; and
   decoding the data block in a pipelined manner using an irregular, block-structured parity check matrix,
   wherein shift values used in the data sub-blocks are optimized by minimizing a cost function to at least reduce a number of cycles of a predetermined length, at least two data sub-block matrices of the parity check matrix are read from and written in each of a plurality of clock cycles, and the reading and writing of the data sub-blocks are evenly distributed between at least two areas of a memory.

2. The method of claim 1, wherein a pipeline comprises at least three layers.

3. The method of claim 1, wherein the decoding is performed with a permuter that uses shift value memory modules to store the position of non-zero sub-block matrices and the shift value/relative offsets.

4. The method of claim 3, wherein the shift value memory modules comprise read only memory.

5. The method of claim 1, wherein the predetermined length is one of 4, 6, and 8.

6. The method of claim 1, wherein there is full processing parallelism for one layer.

7. The method of claim 1, wherein a first area of memory stores data from odd block columns of the parity check matrix and a second area of memory stores data from even block columns of the parity check matrix.

8. The method of claim 1, wherein data throughput is at least 1 Gbits/sec.

9. An apparatus comprising:
   memory configured to store an encoded data block comprising data sub-blocks;
   processors configured to decode the data block in a pipelined manner using an irregular, block-structured parity check matrix,
   wherein at least two data sub-block matrices of the parity check matrix are read from and written in each of a plurality of clock cycles,
   wherein the reading and writing of the data sub-blocks are evenly distributed between at least two areas of the memory, and
   wherein shift values used in the data sub-blocks are optimized by minimizing a cost function to at least reduce a number of cycles of a predetermined length.

10. The apparatus of claim 9, wherein a pipeline comprises at least three layers.

11. The apparatus of claim 9, wherein the decoding is performed with a permuter that uses shift value memory modules to store the position of non-zero sub-block matrices and the shift value/relative offsets.

12. The apparatus of claim 11, wherein the shift value memory modules comprise read only memory.

13. The apparatus of claim 9, wherein the predetermined length is one of 4, 6, and 8.

14. The apparatus of claim 9, wherein there is full processing parallelism for one layer.

15. The apparatus of claim 9, wherein a first area of memory stores data from odd block columns of the parity check matrix and a second area of memory stores data from even block columns of the parity check matrix.

16. The apparatus of claim 9, wherein data throughput is at least 1 Gbits/sec.

17. The apparatus of claim 9, wherein the apparatus is embodied in at least one integrated circuit.

18. A non-transitory computer readable medium tangibly embodied with a program of machine-readable instructions executable by a digital processing apparatus to perform operations comprising:
   storing an encoded data block comprising data sub-blocks; and
   decoding the data block in a pipelined manner using an irregular, block-structured parity check matrix,
   wherein at least two data sub-block matrices of the parity check matrix are read from and written in each of a plurality of clock cycles, wherein the reading and writing of the data sub-blocks are evenly distributed between at least two areas of a memory, and wherein shift values used in the data sub-blocks are optimized by minimizing a cost function to at least reduce a number of cycles of a predetermined length.

19. The medium of claim 18, wherein a pipeline comprises at least three layers.

20. The medium of claim 18, wherein the decoding is performed with a permuter that uses shift value memory modules to store the position of non-zero sub-block matrices and the shift value/relative offsets.

21. The medium of claim 20, wherein the shift value memory modules comprise read only memory.

22. The medium of claim 18, wherein there is full processing parallelism for one layer.

23. The medium of claim 18, wherein a first area of memory stores data from odd block columns of the parity check matrix and a second area of memory stores data from even block columns of the parity check matrix.

24. A device comprising:
at least two means for storing data sub-blocks of an encoded data block;
means for decoding the data block in a pipelined manner using an irregular, block-structured parity check matrix,
wherein at least two data sub-block matrices of the parity check matrix are read from and written in each of a plurality of clock cycles,
wherein the reading and writing of the data sub-blocks are evenly distributed between the at least two storing means, and
wherein shift values used in the data sub-blocks are optimized by minimizing a cost function to at least reduce a number of cycles of a predetermined length.

25. The device of claim 24, wherein a pipeline comprises at least three layers.

* * * * *